METHODS FOR MAKING SEMICONDUCTOR DEVICES

Filed Oct. 5, 1967 2 Sheets-Sheet 1

INVENTORS S. KNIGHT
M. UENOHARA
BY
Roderick B. Anderson
ATTORNEY

United States Patent Office 3,490,140

Patented Jan. 20, 1970

3,490,140

METHODS FOR MAKING SEMICONDUCTOR DEVICES

Stephen Knight, New Providence, and Michiyuki Uenohara, Scotch Plains, N.J., assignors to Bell Telephone Laboratories, Incorporated, Murray Hill and Berkeley Heights, N.J., a corporation of New York Filed Oct. 5, 1967, Ser. No. 673,139
Int. Cl. B01j *17/00;* H01l *7/00*
U.S. Cl. 29—576 9 Claims

ABSTRACT OF THE DISCLOSURE

Epitaxial gallium arsenide bulk-effect diodes are made by the following process: an n-conductivity layer is grown on a slice of $n^+$ gallium arsenide; an $n^{++}$ layer is grown on the n layer; a silver-germanium mixture, or other high temperature alloy or metal, is evaporated on the $n^{++}$ layer and alloyed at about 600 degrees centigrade; the alloy layer is covered with evaporated or electroplated gold or silver; the thickness of the $n^+$ slice is reduced by chemical polishing; an indium-gold, or other lower temperature alloy, layer is evaporated on the $n^+$ slice and alloyed at about 500 degrees centigrade; the indium-gold layer is electroplated with gold or silver; the entire structure is cut by etching into individual elements; and each element is bonded between opposite conductive studs.

BACKGROUND OF THE INVENTION

The structure and operation of bulk-effect devices, known also as two-valley devices and as Gunn-effect devices, are described in detail in a series of papers in the January 1966 issue of the IEEE Transactions on Electron Devices, vol. ED–13, No. 1. As is set forth in these papers, high frequency oscillations can be generated by applying a suitable electric field across a bulk semiconductor sample of substantially uniform constituency having two energy band "valleys" within the conduction band which are separated by only a small energy difference.

The best material found thus far for bulk semiconductor diodes is n-type gallium arsenide. Although bulk-effect diodes have been made using wafers cut from larger crystals of n-type gallium arsenide, such wafers often do not have the homogeneous constituency and freedom from crystalline defects required for optimum operation. More dependably uniform n-type gallium arsenide layers can be made by epitaxial growth on a higher conductivity gallium arsenide substrate. Epitaxial growth refers to a process of deposition of one material onto a crystalline substrate such that the deposited material forms a crystal which constitutes, in effect, an extension of the crystalline lattice structure of the substrate.

As pointed out in the paper "Recent Results With Epitaxial GaAs Gunn-Effect Oscillators" by Brady et al., Proceedings of the IEEE, October 1966, pages 1497–1498, epitaxially grown wafers can be made by the following process: an n-type gallium arsenide active layer 4 to 40 microns thick is epitaxially grown on an $n^+$-type gallium arsenide substrate slice; the slice is lapped to a thickness of about 75 microns; a film of indium-gold, about 1000 Angstroms thick, is evaporated over the entire slice and alloyed; the slice is broken up into small elements of about 100 microns by 100 microns by scribing and breaking the slice; each element is mounted in an individual package which constitutes the diode. Besides acting as a substrate for epitaxial growth and providing support for the active n-type layer, the $n^+$ slice provides a conductivity transition between the n layer and the metal layer to give a good ohmic contact. Likewise, the $n^{++}$ layer is required for giving an ohmic contact. Because of its layered configuration, the part of the diode within the package is referred to as a sandwich structure.

The paper "Heat Flow in $n^{++}$-n-$n^+$ Epitaxial GaAs Bulk-Effect Devices" by Knight, Proceedings of the IEEE, January 1967, pages 112 and 113, computes the heat that can be drained from epitaxially fabricated diodes of the type described above. Heat can effectively be drained from the active n-type layer only by a heat sinking stud on the side of the device opposite the $n^+$ substrate. This is because the substrate, which must be on the order of at least 50 to 75 microns thick to be self-supporting, is too thick to permit any substantial heat flow across it. It would be desirable to increase the capacity for thermal dissipation in a bulk-effect diode because then the diode could be operated at higher electrical power levels.

The problem of overheating in bulk-effect diodes has been sufficiently severe to stimulate the design of rather elaborate circuitry for permitting an array of diodes to operate intermittently with a cooling period between each cycle of operation and for combining the outputs of the various diodes into a continuous wave of power output, as described in the copending application of Barber et al., Ser. No. 586,890, filed Oct. 14, 1966.

SUMMARY OF THE INVENTION

Accordingly, it is an object of this invention to increase the heat dissipating capacity of epitaxially grown bulk-effect devices.

This and other objects of the invention are attained in an illustrative embodiment thereof comprising the process outlined above in the Abstract of the Disclosure.

We have found that a slice of gallium arsenide, by itself, cannot be lapped or polished to a thickness of less than about 75 microns without damaging or disintegrating the slice and associated epitaxial layers, or at least a substantial portion of slices that are processed. We have also found, however, that by electroplating the metalized $n^{++}$ layer prior to polishing, as described in the Abstract, the slice can be reduced to virtually any desired thickness without damaging the active epitaxial n-type layer. Indeed, the entire $n^+$ substrate may be removed as will be described later.

The first alloyed contact, silver-germanium, has a higher melting point than the second alloyed contact, indium-gold, that is formed on the opposite surface of the slice. Thus, the indium-gold layer can be alloyed to the semiconductor at a temperature below the silver-germanium melting point without damaging the silver-germanium layer.

In accordance with our invention, epitaxially grown gallium arsenide devices are made having a much thinner total semiconductor thickness than prior devices, which makes possible the draining of heat during operation from both sides of the sandwich structure. Accordingly, each element that has been cut from the slice is contained between relatively massive copper studs to form a diode which can be operated continuously at higher electrical power than similar prior devices. This is accomplished without substantially increasing the expense of fabrication because all of the semiconductor processing is done on the entire semiconductor slice rather than on individual elements.

In an alternative embodiment, the entire $n^+$ slice is removed during the polishing step and a second $n^{++}$ layer is grown on the n-type layer that has been exposed by the polishing step. This results in a more symmetrical finished product than in the foregoing embodiment or in similar epitaxial devices of the prior art.

DRAWING DESCRIPTION

These and other objects, features, and advantages of the invention will be better understood from the consideration of the following detailed description taken in conjunction with the accompanying drawing, in which.

DETAILED DESCRIPTION

Figures 1, 3, 5:
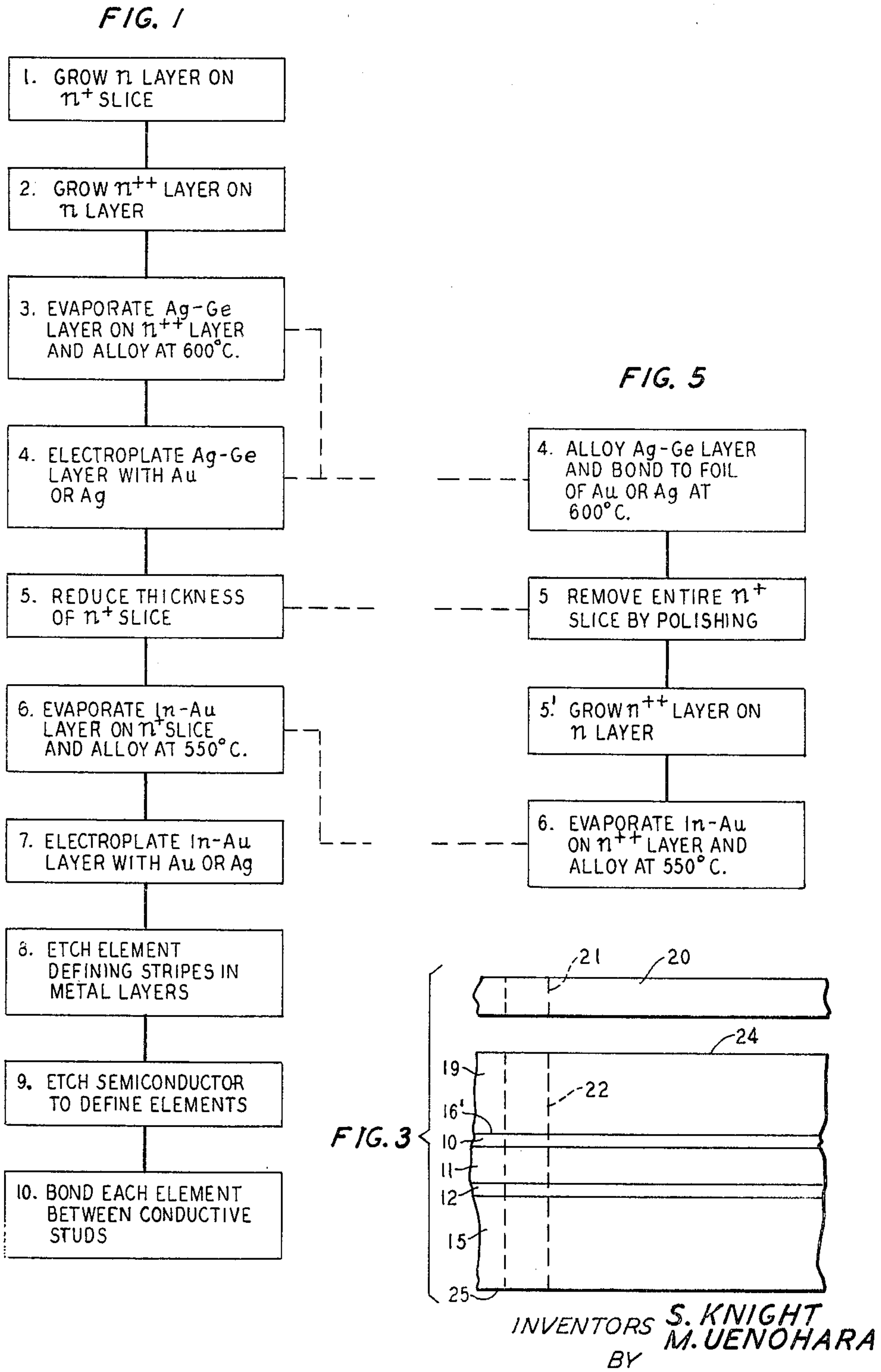
FIG. 1 is a flow chart of a process for making epitaxial semiconductor devices in accordance with one embodiment of the invention.
FIG. 3 is a schematic illustration of part of the semiconductor structure of FIG. 2 at another stage in its fabrication.
FIG. 5 is a flow chart indicating steps of an alternative embodiment of the invention which differ from corresponding steps of the chart of FIG. 1.
Figure 2:
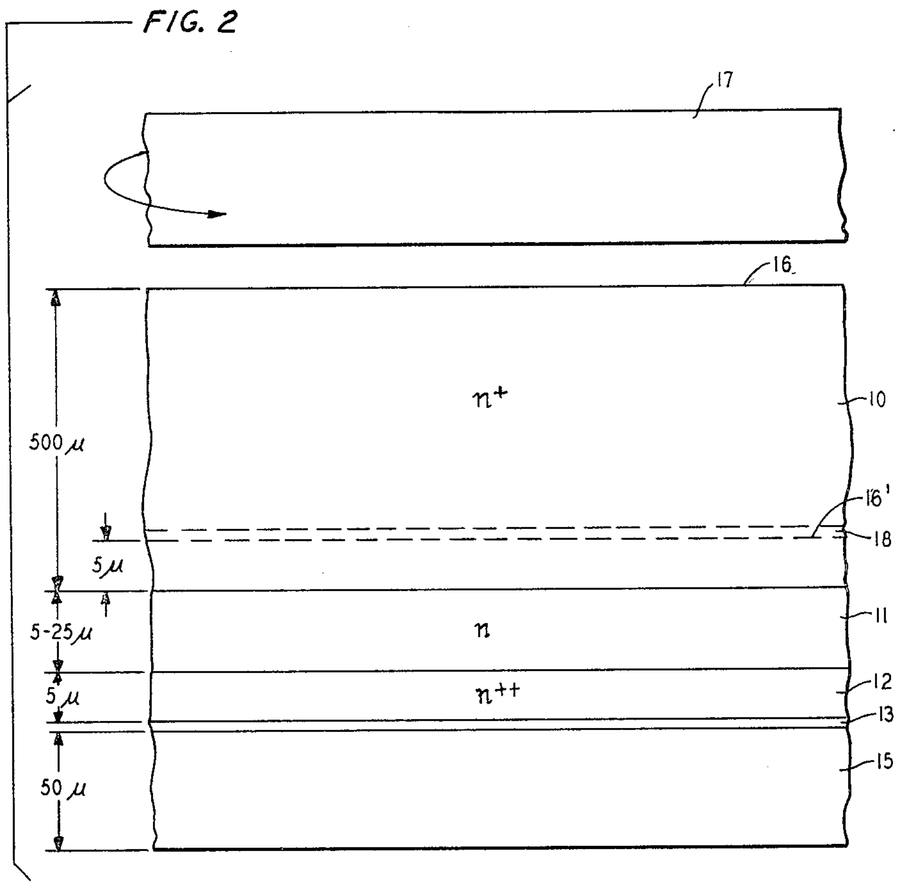
FIG. 2 is a schematic illustration of a partially fabricated semiconductor structure in accordance with the process of FIG. 1.

Referring now to FIGS. 1 and 2, the first step of our process is identical with that of epitaxial processes of the prior art. A slice 10, having a thickness of typically 500 microns, is cut from a rod of solid crystalline $n^+$-type gallium arsenide having a diameter of typically 2–3 centimeters. An n-type gallium arsenide layer 11 is epitaxially grown on the $n^+$ slice. The n layer may typically be grown to a thickness of 5 to 25 microns which is consistent with subsequent diode operation at frequencies in the gigacycle range. The carrier concentration giving n-type conductivity may be in the range of $10^{14}$ to $10^{16}$ carriers per cubic centimeter.

The second step is to grow an $n^{++}$-type layer 12 of gallium arsenide over the surface of the n layer. The term $n^+$ designates a relatively higher carrier concentration and conductivity than n-type, while $n^{++}$ designates a higher conductivity than $n^+$. The carrier concentration of the $n^+$ slice may typically be in the range of $10^{17}$ to $2\times10^{18}$ carriers per cubic centimeter, while that of the $n^{++}$ layer may be on the order of $10^{19}$ to $10^{20}$ carriers per cubic centimeter. The purpose of the $n^{++}$ layer is to provide a conductivity transition between the active n region and a metal contact which is subsequently applied, thereby giving a good ohmic contact. While it has generally been found more convenient to grow epitaxially an $n^{++}$ layer, the layer 12 could also be of any $n^+$ conductivity which is suitably higher than the conductivity of the n layer 11.

The third step is to metalize the surface of the $n^{++}$ layer by evaporating onto it a mixture of approximately 95 percent silver and 5 percent germanium by weight to form a film 13 approximately 1000 Angstroms thick. The structure is then heated to approximately 600 degrees centigrade to alloy the film 13 to the layer 12 to form a low resistance contact. As will become clear later, the silver-germanium combination is chosen because of its relatively high melting point. Other metal alloys can also be used, such as pure silicon or silver-indium-germanium.

The fourth step is to electroplate the metalized surface with a relatively thick layer 15 of gold or silver. As is known in the art, the gold or silver layer 15 should be plated slowly so that the combination of layers 12, 13, and 15 constitute a good ohmic contact to the active layer 11.

The thickness of the $n^+$ slice 10 is then reduced, typically by lapping or polishing the upper surface 16 with a rotating lapping plate 17 and a suitable chemical abrasive mixture included on the upper surface 16. The lapping plate 17 may typically have a thickness of a quarter inch, a diameter of 8 inches, and be rotated at 50 revolutions per minute. The polishing reduces the thickness of the $n^+$ slice to approximately 5 microns such that after polishing the slice has an upper surface 16' shown in phantom in FIG. 2. It is possible to polish the semiconductor slice to a very small thickness only because of the structural support provided by the relatively thick metal layer 15 which has previously been applied. Our experimental findings indicate that layer 15 must be at least 10 microns thick to prevent disintegration of the sandwich structure during polishing, although as described above it is preferably about 50 microns thick.

The surface 16' is next metalized with a thin film 18 of 90 percent indium and 10 percent gold by weight which is deposited by evaporation to a thickness of approximately 1000 Angstroms. The entire structure is then heated to 500° C., to alloy the indium-gold layer into the $n^+$ slice 10. Since the melting point of the silver-germanium layer 13 of FIG. 2 is 600° C., that layer is not affected by the step of alloying the indium-gold film.

Referring to FIG. 3, the next step to electroplate the metalized surface 16' with a gold or sliver layer 19 which, like the layer 15, is approximately 50 microns thick. As before, electroplating should be slow to insure good adhesion.

At this stage, the slice has been completely processed to form a sandwich structure and the next step is to cut or "dice" the structure into individual elements, each suitable for packaging as an individual bulk-effect diode. Because of their thicknesses, the metal layers 19 and 15 cannot be cut by a scribe, but rather they must be etched.

A mask 20 is used for defining the individual elements, and, as is known in the art, may typically have a matrix or grid shape. Because the metal layers 19 and 15 must be individually etched, aligning apertures 21 and 22 are simultaneously drilled through the mask 20 and the sandwich structure. The apertures 21 and 22 are preferably made in a known manner by laser drilling to have a diameter of typically 100 microns. The upper surface 24 is overlayed with a film of photoresist material such as Kodak thin film resist (KTFR) and exposed to light directed through the mask 20 to define the etch pattern on the photoresist film. The mask 20 is then used to expose a similar photoresist film on surface 25 of metal layer 15 by aligning the apertures 21 with apertures 22 in the sandwich structure.

After exposure of the photoresist, the first etch is made by using a suitable etchant such as an aqueous solution of potassium iodide and iodine to cut through the metal layers 19 and 25. Thereafter, the slice is exposed to a semiconductor etchant such as a solution of three parts sulphuric acid, one part hydrogen peroxide, and one part water, or alternatively, an aqueous solution of methanol and bromine. In either case, the etchant cuts the semiconductor with the etched metal layers 15 and 19 acting as masks. The individual elements that are defined in this manner may typically be squares of 100 microns by 100 microns.

Figure 4:
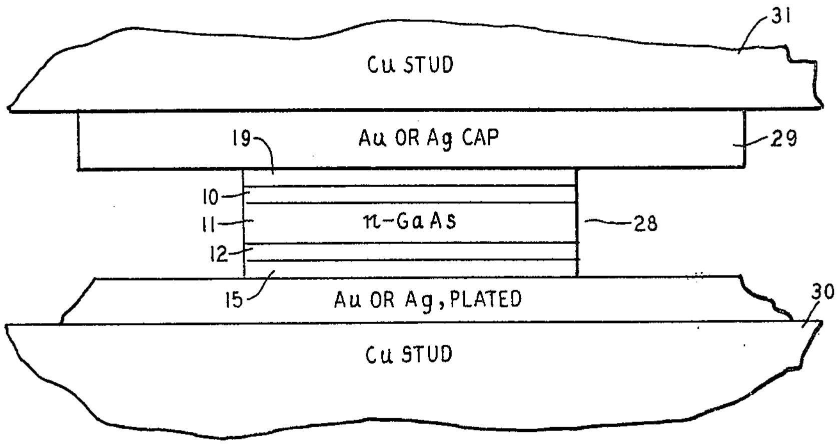
FIG. 4 is a schematic illustration of a bulk-effect semiconductor diode made in accordance with the process of FIG. 1.

Referring to FIG. 4, each individual element 28 may then be thermal compression bonded between a gold or silver disk 29 and a gold or silver plated copper stud 30. The gold disk 29 is then brazed to a copper stud 31 to form the package shown schematically. The entire structure of FIG. 4 is preferably encapsulated with a suitable potting compound such as known silicone mixtures.

The n-type active region 11 of the finished diode is separated from its opposite metal contacts by inactive semiconductive layers 10 and 12 which are each only on the order of 1 to 5 microns thick. As a result, low thermal impedance paths are provided from the active region 11 to copper studs 30 and 31 which both act as heat sinks. Because of heat sinking on both sides, it can be shown that the diode of FIG. 4 has approximately twice the heat dissipation capacity of present epitaxially grown gallium arsenide bulk-effect diodes, and as a consequence, it is capable of operating at much higher power levels. These advantages are all realized without sacrificing the quality inherent in epitaxial processing and without substantially complicating or increasing the cost of fabrication.

FIG. 5 shows steps which may be used alternatively to steps 4, 5 and 6 of the process of FIG. 1. Simultaneously with alloying the gold-germanium film, the film may be bonded to a 50 micron thick foil of gold or silver at 600° C. In Step 5, instead of merely reducing the thickness of the $n^+$ slice 10 of FIG. 2, the entire $n^+$ slice is removed by polishing all the way to the n layer 11. An $n^{++}$ layer is then epitaxially grown on the exposed surface of the n layer 11. Next, the indium-gold film is evaporated on the $n^{++}$ layer for subsequent electroplating and further processing as in FIG. 1. This alternative process leads to bulk devices as shown in FIG. 4 having an inactive layer 10 of the same conductivity as the layer 12, which makes the device symmetrical and avoids the possibility that the layer 10 may act as part of the active element during operation of the diode.

Various other embodiments and modifications of our process may be made by those skilled in the art without departing from the spirit and scope of the invention.

What is claimed is:

1. A process for making semiconductor devices comprising the steps of:
forming a slice of semiconductor material of a first conductivity, said slice being too fragile to polish to a thickness of less than a prescribed value;
forming a layer of semiconductor material on a surface of the slice;
forming a first metal layer at least 10 microns thick on the semiconductor layer, thereby providing structural support to the semiconductor slice;
polishing said slice to a thickness of less than said prescribed value;
forming a second metal layer on a surface of semiconductor material opposite the first metal layer, the metal layers and semiconductor layers forming a sandwich structure;
and dividing the sandwich structure into a plurality of elements.

2. The process of claim 1 wherein:
the step of forming the semiconductor layer comprises the steps of forming a first semiconductor layer on the slice having a different conductivity than the slice and forming a second semiconductor layer on the first semiconductor layer, the second semiconductor layer having a different conductivity than the first semiconductor layer.

3. The process of claim 2 wherein:
the polishing step comprises the step of eliminating from the sandwich structure all of the slice of semiconductor material of the first conductivity, thereby exposing a surface of said first semiconductor layer.

4. The process of claim 3 further comprising:
the step of forming on the exposed first semiconductor layer a third semiconductor layer having substantially the same conductivity as the second semiconductor layer.

5. The process of claim 2 wherein:
the step of forming the first metal layer comprises the step of heating a first metal to alloy it with the second semiconductor layer;
and the step of forming the second metal layer comprises the step of heating a second metal to a temperature which is above its melting point but below the melting point of the first metal and alloying it on a surface of semiconductor material opposite the first metal layer.

6. The process of claim 5 wherein:
the slice is of $n^+$-type gallium arsenide;
and the step of forming the first semiconductor layer comprises the step of epitaxially growing a layer of n-type gallium arsenide for the surface of the slice.

7. The process of claim 6 wherein:
the first metal is a mixture of gold and germanium having a melting point of about 600° C., and the second metal is a mixture of indium and gold having a melting point of about 550° C.

8. The process of claim 5 further comprising:
forming a first etching pattern on the exposed surface of the first metal layer;
forming a second etching pattern on the exposed surface of the second metal layer which is aligned with the first etching pattern;
etching the metal layers by exposing the structure to a first etchant;
and etching the semiconductor by exposing the structure to a second etchant.

9. The process of claim 8 further comprising the step of:
drilling holes through a mask and through the sandwich structure; and wherein:
the first etching pattern is formed by aligning the hole of the mask with corresponding holes in the first metal layer and exposing a film of photoresist material overlaying the first metal layer to light directed through the mask;
and the second etching pattern is formed by aligning the holes of the mask with corresponding holes in the second metal layer and exposing a film of photoresist material overlaying the second metal layer to light directed through the mask.

References Cited

UNITED STATES PATENTS

| | | | |
|---|---|---|---|
| 3,290,753 | 12/1966 | Chang | 29—578 |
| 3,391,023 | 7/1968 | Frescura | 29—576 |
| 3,400,309 | 9/1968 | Doo | 317—235 |
| 3,407,479 | 10/1968 | Fordemoact et al. | 29—577 |
| 3,411,200 | 11/1968 | Formigone. | |
| 3,423,823 | 1/1969 | Ansley | 156—17 |

PAUL M. COHEN, Primary Examiner

U.S. Cl. X.R.

29—578, 589; 148—175; 156—17; 317—235